(12) United States Patent
Cheng et al.

(10) Patent No.: US 12,364,069 B2
(45) Date of Patent: Jul. 15, 2025

(54) METHOD OF MANUFACTURING LIGHT EMITTING PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wei-Te Cheng, Taipei (TW); Kuo-Ming Chiu, New Taipei (TW); Kai-Chieh Liang, New Taipei (TW); Jie-Ting Tsai, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 91 days.

(21) Appl. No.: 17/971,528

(22) Filed: Oct. 21, 2022

(65) Prior Publication Data
US 2023/0038896 A1 Feb. 9, 2023

Related U.S. Application Data

(62) Division of application No. 16/681,970, filed on Nov. 13, 2019, now Pat. No. 11,522,109.

(30) Foreign Application Priority Data

Dec. 5, 2018 (CN) .......................... 201811478852.6

(51) Int. Cl.
*H10H 20/01* (2025.01)
*H10H 20/85* (2025.01)
*H10H 20/852* (2025.01)

(52) U.S. Cl.
CPC ...... *H10H 20/8506* (2025.01); *H10H 20/852* (2025.01); *H10H 20/036* (2025.01); *H10H 20/0362* (2025.01)

(58) Field of Classification Search
CPC ...................... H01L 2933/005; H10H 20/0362
(Continued)

(56) References Cited

U.S. PATENT DOCUMENTS

| | | | |
|---|---|---|---|
| 12,027,506 B2* | 7/2024 | Chen | H01L 25/0753 |
| 2015/0175861 A1* | 6/2015 | Nagata | F16J 15/022 524/588 |
| 2017/0229614 A1* | 8/2017 | Kim | H01L 33/52 |

FOREIGN PATENT DOCUMENTS

JP          2000036384 A  *  2/2000    ......... H01L 51/5237

OTHER PUBLICATIONS

Machine translation of Ooishi, JP-2000036384-A (Year: 2000).*

* cited by examiner

*Primary Examiner* — Hsin Yi Hsieh
(74) *Attorney, Agent, or Firm* — Li & Cai Intellectual Property (USA) Office

(57) ABSTRACT

A method of manufacturing the light emitting package structure is provided. The method includes: a preparation process: mounting a light emitting unit on a substrate; a dispensing process: coating a sealant on a first joint area of the substrate; a cover-enclosing process: disposing a cover element having a second joint area on the substrate, the first joint area and the second joint area joined to each other by the sealant; a vacuum process: reducing an ambient pressure to a first pressure lower than the original ambient pressure; a pressure-adjusting process: adjusting the ambient pressure
(Continued)

around the package structure to a second pressure higher than the first pressure; and a curing process: curing the sealant.

13 Claims, 10 Drawing Sheets

(58) Field of Classification Search
USPC .......................................................... 438/26
See application file for complete search history.

METHOD OF MANUFACTURING LIGHT EMITTING PACKAGE STRUCTURE

CROSS-REFERENCE TO RELATED PATENT APPLICATION

This application is a divisional application of Ser. No. 16/681,970 filed on Nov. 13, 2019, entitled "LIGHT EMITTING PACKAGE STRUCTURE AND METHOD OF MANUFACTURING THE SAME", which claims the benefit of priority to China Patent Application No. 201811478852.6, filed on Dec. 5, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a method of manufacturing a light emitting package structure.

BACKGROUND OF THE DISCLOSURE

FIG. 13A and FIG. 13B illustrate a conventional light emitting package structure 100. The package structure 100 includes a substrate 101, a cover element 102 and a light emitting chip 103. The package structure 100 packages the light emitting chip 103 in an accommodation space 105 through the cover element 102. The cover element 102 is usually fixed to an opening of the accommodation space 105 through a sealant 104. However, during the curing of the sealant 104 under the normal pressure, the cover element 102 often has undesirable conditions such as skewing, which leads to an increase in the defect rate of the package structure 100.

SUMMARY OF THE DISCLOSURE

In response to the above-referenced technical inadequacies, the present disclosure provides a method of manufacturing a light emitting package structure, capable of improving yield.

In one aspect, the present disclosure provides a method of manufacturing a light emitting package structure. The method includes: a preparation process: mounting the light emitting unit on the substrate; a dispensing process: coating the sealant on a first joint area of the substrate; an cover-enclosing process: disposing the cover element having a second joint area on the substrate, the first joint area and the second joint area joined to each other by the sealant; a vacuum process: reducing an ambient pressure to a first pressure lower than the original ambient pressure; a pressure-adjusting process: adjusting the ambient pressure around the package structure to a second pressure higher than the first pressure; and a curing process: curing the sealant.

Therefore, the method of manufacturing the light emitting package structure disclosed in the present disclosure can improve the yield of the final product of the light emitting package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
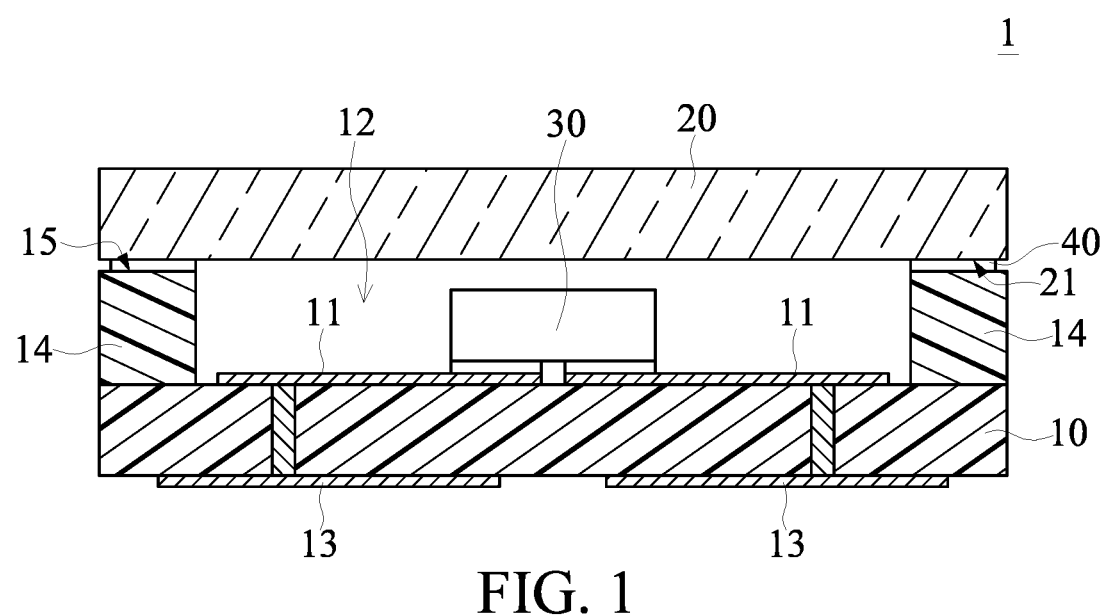
FIG. 1 is an assembled cross sectional view of a light emitting package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. FIG. 1 to FIG. 12 illustrate embodiments of the present disclosure. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

FIG. 1 illustrates a light emitting package structure 1 manufactured by a method of an embodiment of the present disclosure. The light emitting package structure 1 includes a substrate 10, a cover element 20, a light emitting unit 30 and a sealant 40. The substrate 10 includes two chip mounting pads 11, and the two chip mounting pads 11 are electrically connected to solder pads 13. The light emitting unit 30 is disposed on the chip mounting pads 11 of the substrate 10 such that the light emitting unit 30 is electrically connected to the solder pads 13 through the chip mounting pads 11. The substrate 10 has a wall structure 14, and the wall structure 14 has an annular first joint area 15 on the side opposite to the substrate 10. The cover element 20 is disposed on the substrate 10. An accommodation space 12 is formed between the cover element 20 and the substrate 10, and the light emitting unit 30 is accommodated in the accommodation space 12. The cover element 20 has a second joint area 21 opposite to the first joint area 15. The second joint area 21 and the first joint area 15 are joined to each other and surround the accommodation space 12. The sealant 40 is provided in a gap between the first joint area 15 and the second joint area 21. The first joint area 15 and the second joint area 21 are joined through the sealant 40 so that the accommodation space 12 is sealed.

After the package structure 1 is manufactured, the accommodation space 12 is in a negative pressure state (i.e. the pressure in the accommodation space 12 is less than 1 atmosphere) to package the light emitting unit 30 in a vacuum environment, such that the light emitting unit 30 does not contact air and moisture, and the service life thereof can be prolonged. Therefore, the light emitting package structure 1 disclosed in the present disclosure is particularly suitable for packaging air or moisture sensitive light emitting chips, such as ultraviolet light emitting chips, and especially deep-ultraviolet light emitting diodes. Therefore, the light emitting unit 30 can be any light emitting chip, such as a light emitting chip having a peak wavelength between 100 nm and 400 nm. In some embodiments, the light emitting unit 30 is exemplified as a UVC LED having a peak wavelength between 100 nm and 280 nm, a UVB LED having a peak wavelength between 280 nm and 315 nm or a UVA LED having a peak wavelength between 315 nm and 400 nm.

A method of manufacturing the light emitting package of the embodiment of the present disclosure is described as follows. The method of the present disclosure includes a preparation process, a dispensing process, a cover-enclosing process, a vacuum process, a pressure-adjusting process and a curing process. The implementation of the method of the present disclosure is not limited to the aforementioned steps and order.

Figure 2:
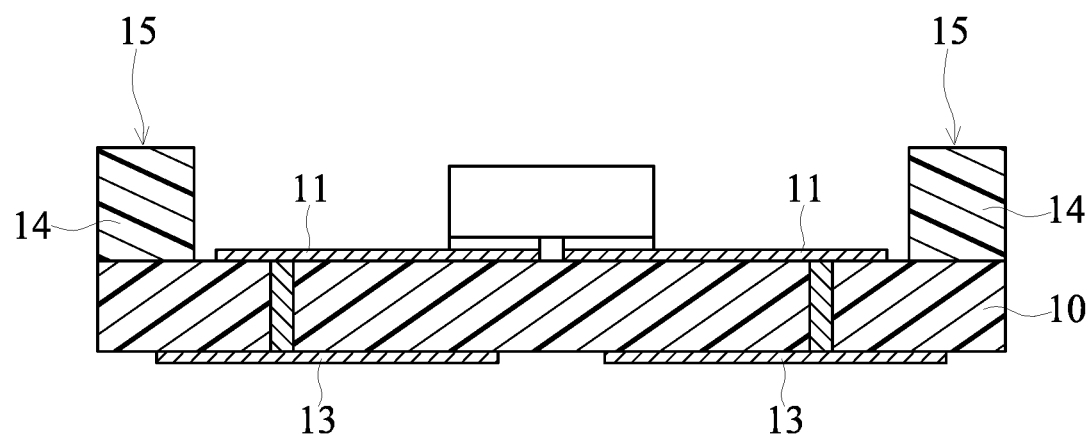
FIG. 2 is a schematic view of a preparation process of a method of manufacturing the light emitting package structure according to the first embodiment of the present disclosure.

FIG. 2 shows the preparation process: mounting the light emitting unit 30 on the chip mounting pads 11 of the substrate 10. When the light emitting unit 30 is disposed on the substrate 10, the light emitting unit 30 is electrically connected to the solder pads 13 on the substrate 10, and the light emitting unit 30 is accommodated in a recess jointly defined by an inner side wall of the wall structure 14 and the substrate 10. In this embodiment, the materials of the substrate 10 and the wall structure 14 may be selected from, for example, ceramic materials and polymer materials, and the materials can both reflect light emitted by the light emitting unit 30. Preferably, the substrate 10 and the wall structure 14 are made of the same material and integrally formed.

Figure 3:
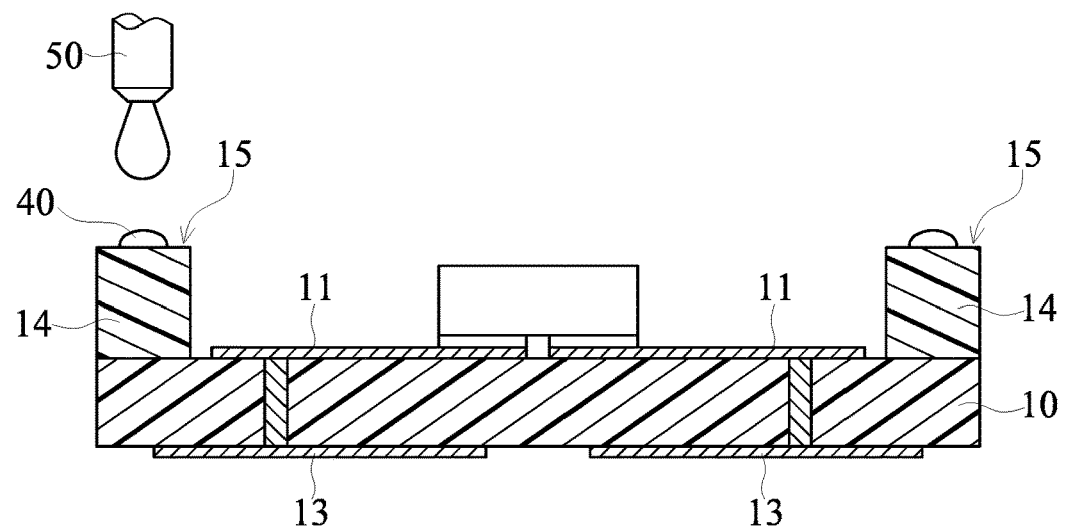
FIG. 3 is a schematic view of a dispensing process of the method of manufacturing the light emitting package structure according to the first embodiment of the present disclosure.
Figure 4:
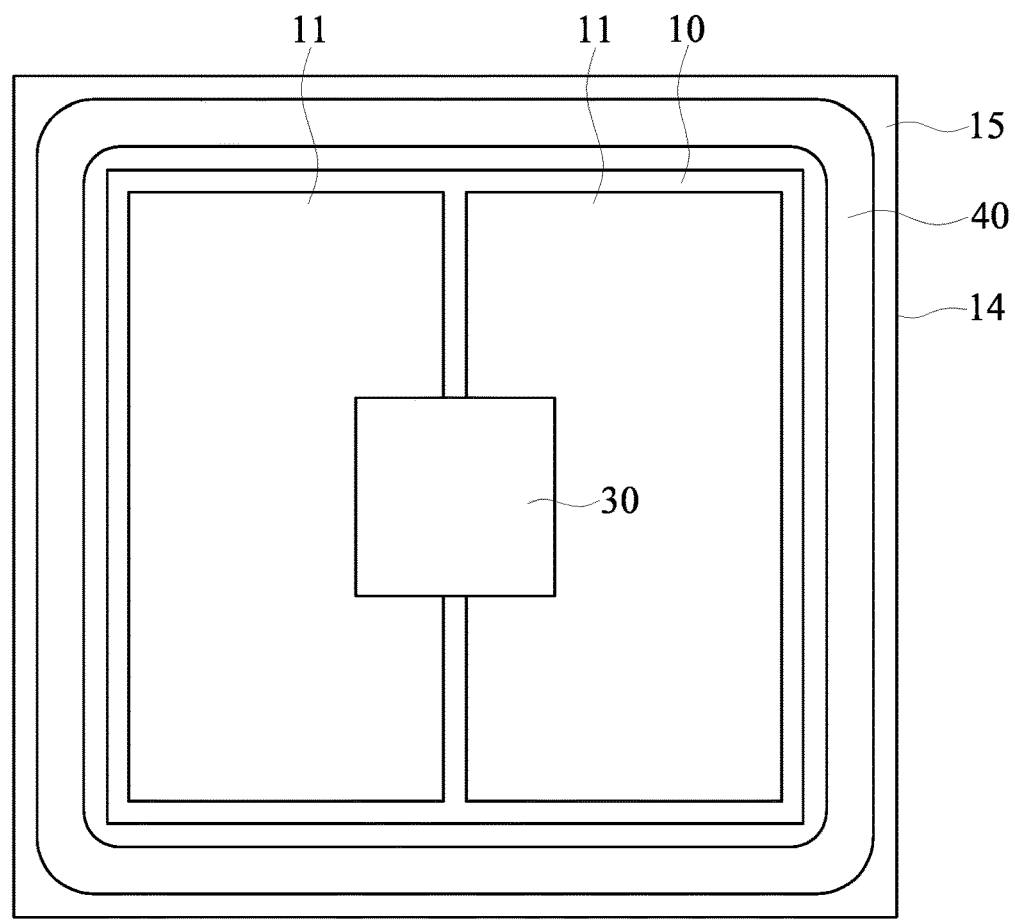
FIG. 4 is a top view of the dispensing process of the method of manufacturing the light emitting package structure according to the first embodiment of the present disclosure.

FIG. 3 and FIG. 4 show the dispensing process: coating the uncured sealant 40 on the first joint area 15 of the substrate 10 along an annular path through a dispensing device nozzle 50.

It should be noted that as a dispensing amount in the dispensing process affects the quality and yield of the final product of the package structure 1 of the present disclosure, a width of the sealant 40 coated on the first joint area 15 should be precisely controlled. In the dispensing process, the width of the sealant 40 coated on the first boding area 15 should be controlled between a quarter and three quarters of the width of the first joint area 15. In a preferred embodiment, the width of the sealant 40 coated on the first joint area 15 is between one-third and two-thirds of the width of the first joint area 15. In a further preferred embodiment of the present disclosure, the width of the sealant 40 coated on the first joint area 15 is between one-third and one half of the width of the first joint area 15.

Moreover, in some embodiments of the present disclosure, the sealant 40 is preferably a thermosetting adhesive having ultraviolet light resistance, such as a silicone based thermosetting adhesive, to prevent the sealant 40 from being deteriorated by the light emitted from the light emitting unit 30. Preferably, the sealant 40 is an adhesive having a thixotropic coefficient between 2.8 and 4, and a viscosity between 10 Pas and 18 Pas, to prevent the sealant 40 from being broken by a pressure difference $\Delta P$ in the vacuum process. Preferably, the curing temperature is between 140° C. and 160° C. to prevent chips or other components from being damaged by high temperatures in the curing process. However, the present disclosure is not limited thereto, and based on the content of the present disclosure, those skilled in the relevant art can change the adhesive characteristics of the sealant 40 according to practical requirements.

Figure 5:
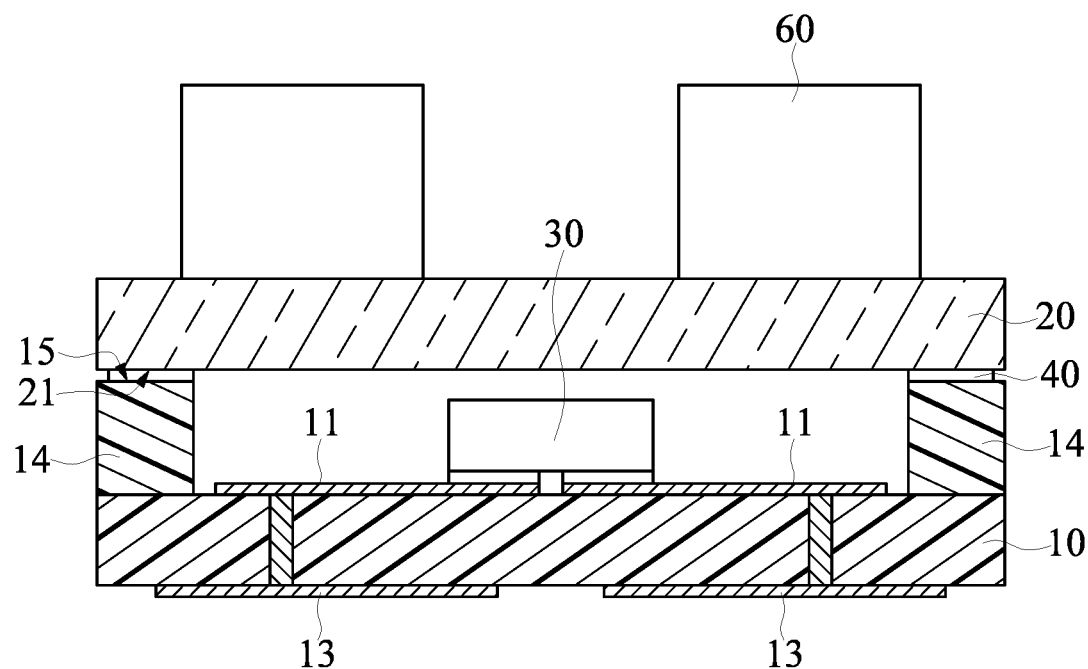
FIG. 5 is a schematic view of a cover-enclosing process of the method of manufacturing the light emitting package structure according to the first embodiment of the present disclosure.

FIG. 5 shows the cover-enclosing process: disposing the cover element 20 on the substrate 10 through a pickup device 60. When the cover element 20 is disposed on the substrate 10, the second joint area 21 of the cover element 20 and the first joint area 15 are opposed to each other and contact the sealant 40, so that the first joint area 15 and the second joint area 21 can be joined to each other through the sealant 40.

Figure 6:
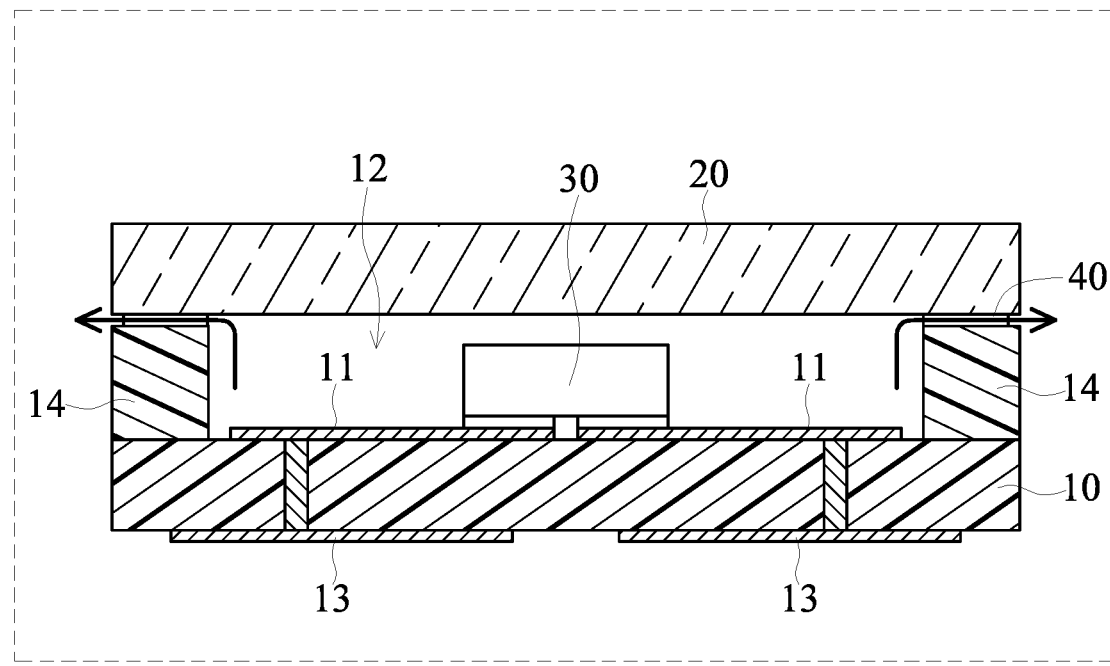
FIG. 6 is a schematic view of a vacuum process of the method of manufacturing the light emitting package structure according to the first embodiment of the present disclosure.

FIG. 6 shows the vacuum process: reducing an ambient pressure to a first pressure lower than the original ambient pressure. The ambient pressure is defined as the pressure around the package structure 1, and the original pressure of the ambient pressure is defined as the pressure around the package structure 1 before the vacuum process is performed. The original pressure can be 1 atmosphere, and the first pressure can be less than 0.01 MPa. After the vacuum process, the pressure around the package structure 1 and the pressure in the accommodation space 12 can both be lower than the original pressure of the ambient pressure.

Specifically, a vacuum device used in the vacuum process can be a vacuum chamber. The package structure 1 can be accommodated in the vacuum chamber, and the pressure in the vacuum chamber can be lowered to the first pressure by extracting air.

In addition, the vacuum process can have various embodiments. In one of the embodiments, after the cover-enclosing process is performed, the ambient pressure around the package structure 1 is reduced to the first pressure through the vacuum device, and the first pressure is maintained for a predetermined time. In this step, since the sealant 40 is not completely cured, gas in the accommodation space 12 can pass through the sealant 40, and the gas in the accommodation space 12 can be sucked out to the outside of the accommodation space 12 by vacuum suction, so that the pressure of the accommodation space 12 approaches the first pressure.

It should be stated that in this embodiment, the predetermined time during which the first pressure is maintained is determined according to a time for reducing the pressure in the accommodation space 12 to the first pressure, and thus the predetermined time in which the first pressure is maintained can be changed according to practical requirements. According to practical tests, in this embodiment, the time in which the first pressure is maintained is between 2 and 5 minutes, and in a preferred embodiment, between 3 and 4 minutes.

In another embodiment of the vacuum process, before the cover-enclosing process is performed, the vacuum process is performed. In this way, after the ambient pressure is reduced to the first pressure, the cover-enclosing process is performed under the first pressure. This embodiment is characterized in that the cover-enclosing process is performed under the negative pressure environment. Therefore, upon the disposing of the cover element 20 on the substrate 10, the accommodation space 12 would be in a vacuum state, so that the additional time for extracting the gas in the accommodation space 12 is not required.

Figure 7:
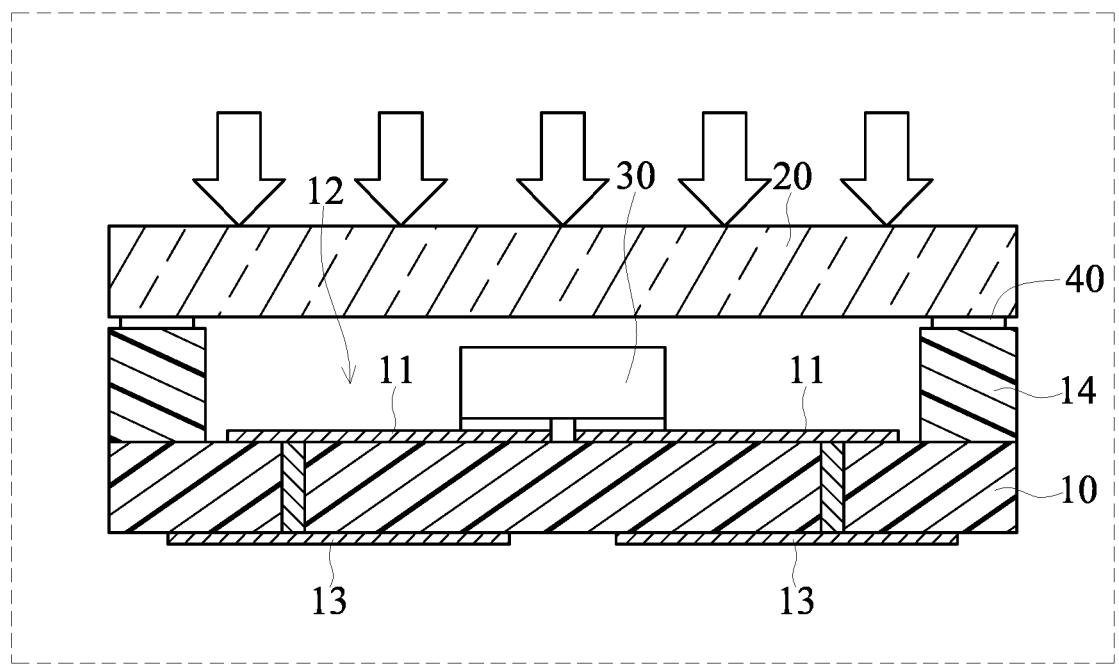
FIG. 7 is a schematic view of a pressure-adjusting process of the method of manufacturing the light emitting package structure according to the first embodiment of the present disclosure.
Figure 8:
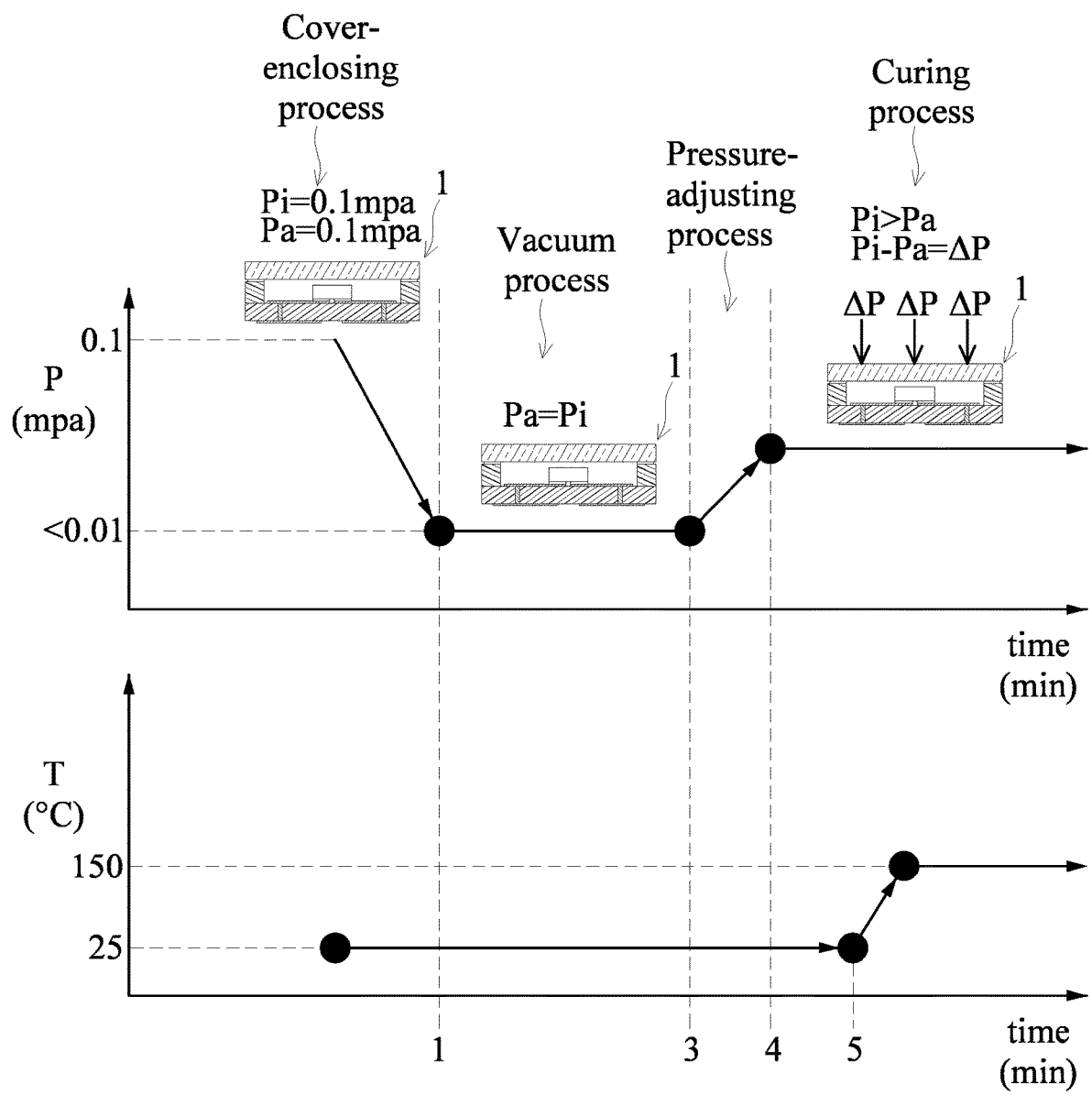
FIG. 8 illustrates a pressure curve and a temperature curve of the method of manufacturing the light emitting package structure while performing each process according to the first embodiment of the present disclosure.

FIG. 7 shows the pressure-adjusting process: adjusting the ambient pressure around the package structure 1 to a second pressure higher than the first pressure. FIG. 8 illustrates a pressure curve and a temperature curve of the method of manufacturing the light emitting package structure. After the vacuum process, an internal pressure Pa of the package structure 1 is equal to an external pressure Pi of the package structure 1, and the external pressure Pi and the internal pressure Pa are equal to the first pressure. After the pressure-adjusting process is performed, when the external pressure Pi of the package structure 1 is increased to the second pressure, the external pressure Pi is larger than the internal pressure Pa, and the external Pi and the internal pressure Pa have a pressure difference $\Delta P$. Therefore, a pressure formed by non-contact pressuring is applied to the cover element 20 and forces the cover element 20 to be against the substrate 10 and the sealant 40.

It should be stated that in the pressure-adjusting process, the larger the difference between the second pressure and the first pressure is, the more the pressure applied to the cover element 20 is. Therefore, contact pressure between the cover element 20 and the sealant 40 is increased, so that the sealant 40 of the final product of the package structure 1 is thinner. That is, in the pressure-adjusting process, if the second pressure rises too much relative to the first pressure, the final product of the sealant 40 is likely to be too thin and lack of adhesiveness, such that the cover element 20 disengages easily or the gap between the cover element 20 and the substrate 10 cannot be sealed. Furthermore, if the second pressure is too high, a vacuum degree around the package structure 1 is insufficient so that the vacuum degree inside the accommodation space 12 is affected. On the contrary, if the increase in the second pressure in the pressure-adjusting process is insufficient, the thickness of the sealant 40 is too large so that the cover element 20 is prone to skew in the subsequent processes.

Therefore, a pressure difference between the second pressure and the first pressure is preferably between 0.01 and 0.03 MPa. Based on the above, the thickness of the final product of the package structure 1 is controlled between 30 and 55 μm, and in a preferred embodiment, the thickness of the final product of the sealant 40 is between 30 and 45 μm.

FIG. 8 shows the curing process: in an environment where the second pressure is maintained, a heating process is performed to heat the temperature around the package structure 1 to a cure temperature, and the cure temperature is maintained for a predetermined time so that the sealant 40 is heated and cured. It should be noted that the cure temperature and the predetermined time for curing in the curing process are adjusted according to the material properties of the sealant 40. In some embodiments of the present disclosure, the cure temperature is preferably between 140° C. and 160° C. and the time for curing is preferably between 180 and 300 minutes.

As shown in FIG. 8, in the present disclosure the curing process is performed in the environment where the second pressure is maintained. During the curing process, the external pressure Pi is larger than the internal pressure Pa, the external pressure Pi and the internal pressure Pa have the pressure difference $\Delta P$ formed by non-contact pressuring, and the pressure difference $\Delta P$ is evenly applied to the cover element 20. Therefore, the cover element 20 is less prone to skew during the curing process of the sealant 40, thereby improving the yield of the package structure 1 of the present disclosure.

In addition, in another embodiment of the curing process, the heating process is performed under the second pressure and the cure temperature is maintained for 40 to 60 minutes to preliminarily cure the sealant 40. Then, the cure temperature is further maintained for 120 to 260 minutes to completely cure the sealant 40. This embodiment adopts a two-stage curing process, and has advantages that only the first stage of the curing process is performed under negative pressure, while the second stage of the curing process is performed under normal pressure, thereby saving the time for using the vacuum device and improving the efficiency of using the vacuum device.

It should be noted that in the embodiment shown in FIG. 8, the curing process is performed after the pressure-adjusting process. However, in another embodiment, the pressure-adjusting process can be performed during the curing process. Specifically, "during the curing process" means during a process in which the sealant 40 is heated to change from a fluid state to a cured state after the sealant 40 is heated to the cure temperature in the curing process. In this embodiment, the heating process can be performed during the curing process, but the pressure-adjusting process is performed before the sealant 40 is cured. Although in this embodiment the time point of performing pressure-adjusting process is later than the time point of performing the curing process, since the pressure-adjusting process is performed before sealant 40 is cured, when the sealant 40 is heated to be cured, the pressure difference ΔP caused by the pressure-adjusting process forces the cover element 20 to press against the sealant 40, thereby preventing the occurrence of skewing of the cover element 20.

Figure 9:
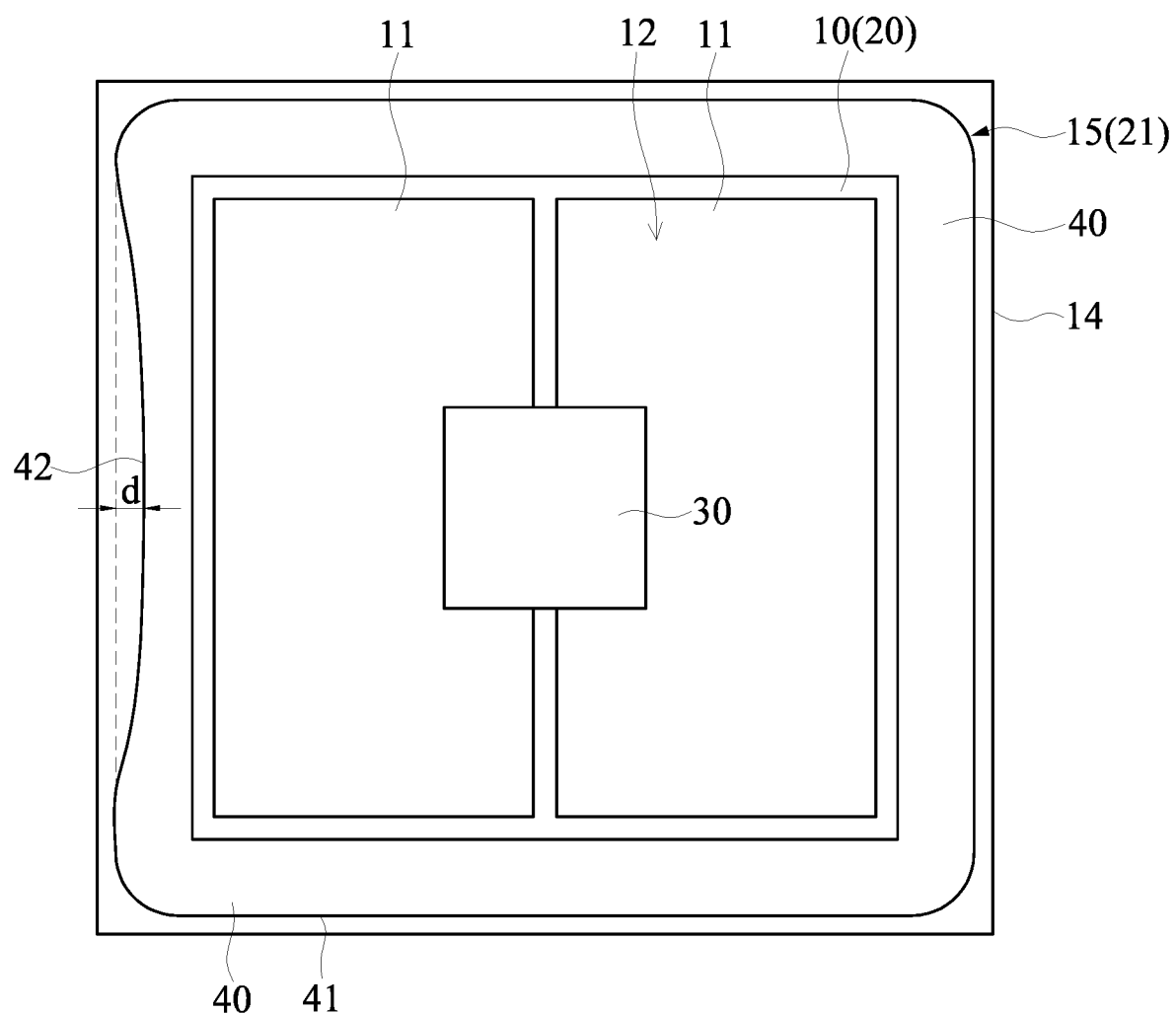
FIG. 9 is a top view of the light emitting package structure according to the first embodiment of the present disclosure.

FIG. 1 and FIG. 9 show the final product of the package structure 1 manufactured by using the method of the present disclosure. In the final product of the package structure 1, the accommodation space 12 is under negative pressure and thus the light emitting package structure having the sealant 40 recessed inward is formed. The sealant 40 of the package structure 1 forms an annular body surrounding the outside of the accommodation space 12. The sealant 40 has an outer profile 41 formed on a side with respect to the accommodation space 12, and at least one side of the outer profile 41 forms a recess portion 42 recessed toward the accommodation space 12.

Since the pressure-adjusting process is performed before the sealant 40 is completely cured, the sealant 40 is pushed by the external pressure and the at least one side of the outer profile 41 of the sealant 40 is pushed under pressure to retract toward the accommodation space 12 so that the recess portion 42 is formed.

Further, in a preferred embodiment of the present disclosure shown in FIG. 9, the recess portion 42 is roughly in an arc shape. The maximum width of the sealant 40 is 50% to 95% of the width of the first joint area 15 or the second joint area 21. A depth d of the recess portion 42 is greater than or equal to a quarter of the width of the first joint area 15 or the second joint area 21. With the abovementioned range, the joint strength between the substrate 10 and the cover element 20 can be maintained.

Figure 13A:
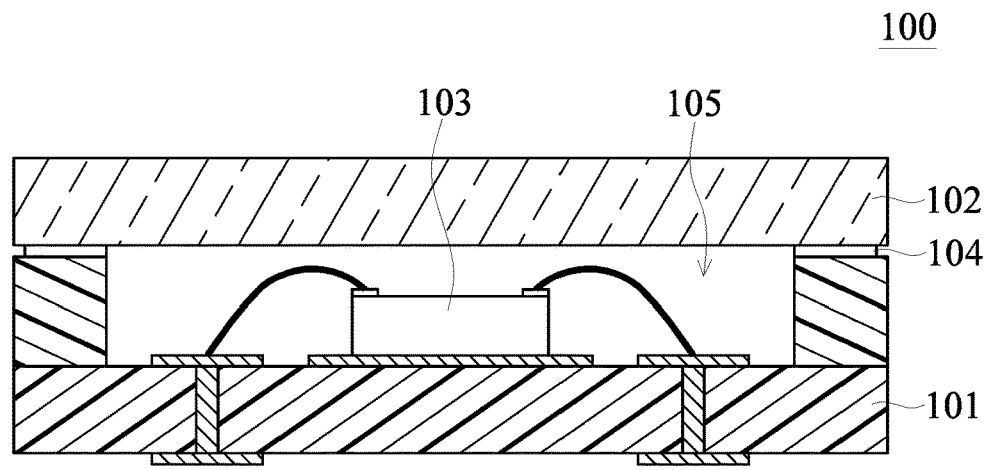
FIG. 13A and FIG. 13B are a cross sectional view and a top view of a light emitting package structure manufactured by a conventional method.
Figure 13B:
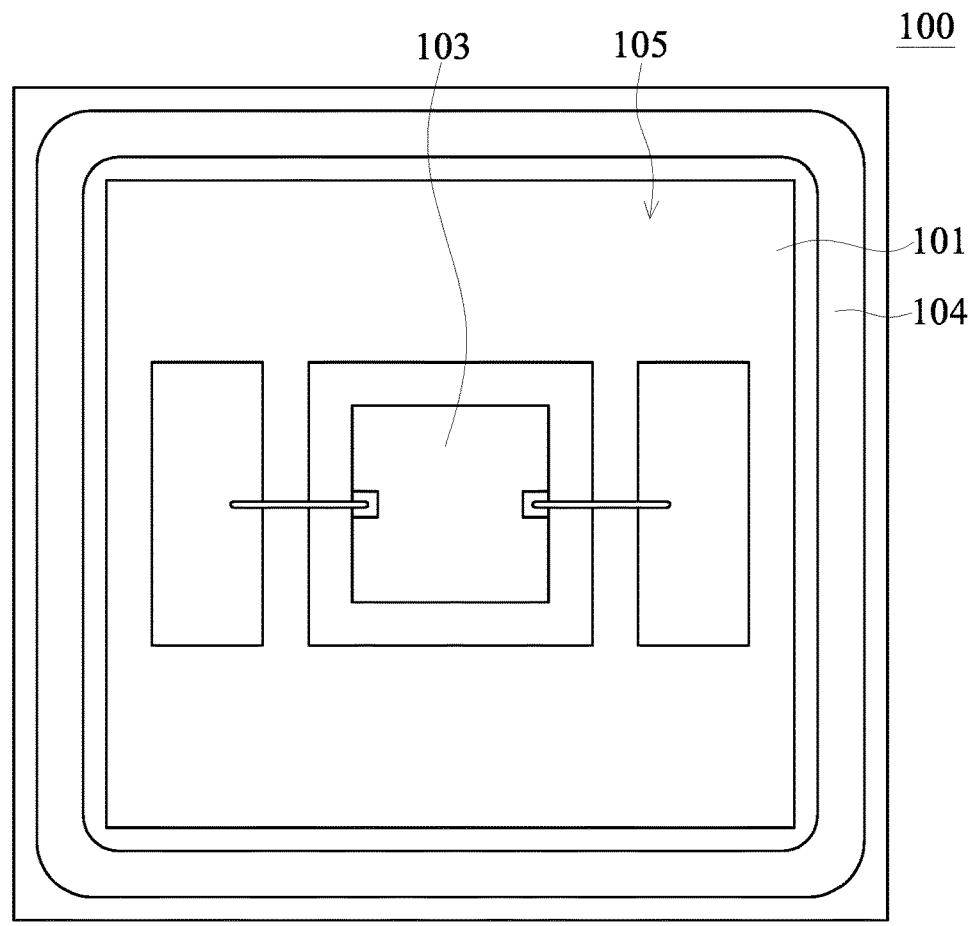

In FIG. 9 illustrating the method of the present disclosure, since the pressure-adjusting process is performed during the curing process, the recess portion 42 is produced at the at least one side of the outer profile 41 of the sealant 40. On the contrary, referring to FIG. 13B showing a package structure 100 manufactured by using the conventional method, since the pressure-adjusting process is not performed during the curing process of a sealant 104 of the package structure 100, an outer profile of the sealant 104 does not have an apparent recess portion and the cover element 102 of the package structure 100 is prone to skew.

Second Embodiment

Figure 10:
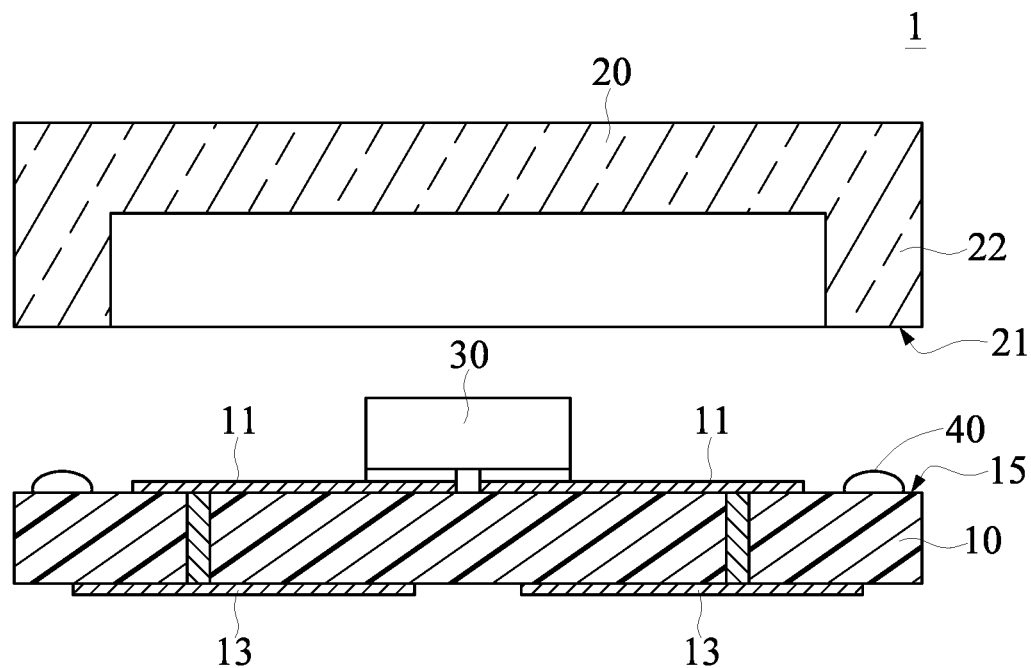
FIG. 10 and FIG. 11 are assembled cross sectional views of the light emitting package structure according to a second embodiment of the present disclosure.
Figure 11:
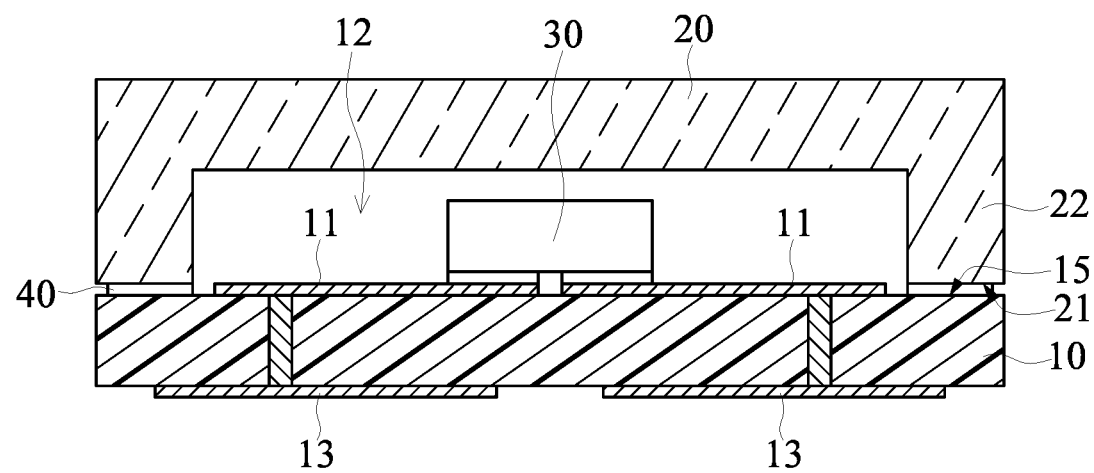

FIG. 10 and FIG. 11 show another embodiment of the light emitting package structure of the present disclosure. In this embodiment, the package structure 1 includes: the substrate 10, the light emitting unit 30 and the cover element 20. The substrate 10 includes the chip mounting pads 11 on a side facing the cover element 20, the light emitting unit 30 is disposed on the chip mounting pads 11 and the substrate 10 forms the first joint area 15 at the periphery of the side facing the cover element 20. The cover element 20 is a light-permeable cover element and has a side structure 22 surrounding the outside of the cover element 20 at the side facing the substrate 10. In this embodiment, the first joint area 15 is formed on the periphery of the side of the substrate 10 facing the cover element 20, and the second joint area 21 is formed on the side of the sidewall structure 22 facing the substrate 10. The material of the cover element 20 may be selected from, for example, ceramics and polymers, preferably glass and quarts.

After the cover element 20 is disposed on the substrate 10, the first joint area 15 and the second joint area 21 is joined by the sealant 40 and the substrate 10, the sidewall structure 22 and the cover element co-define the accommodation space 12 accommodating the light emitting unit 30.

The package structure 1 of this embodiment is manufactured in the same manner as in the first embodiment. Also, there is also a recess portion formed at the at least one side of the sealant 40. Since the manufacturing method in this embodiment is the same as in the first embodiment, the description thereof will not be repeated herein.

Third Embodiment

Figure 12:
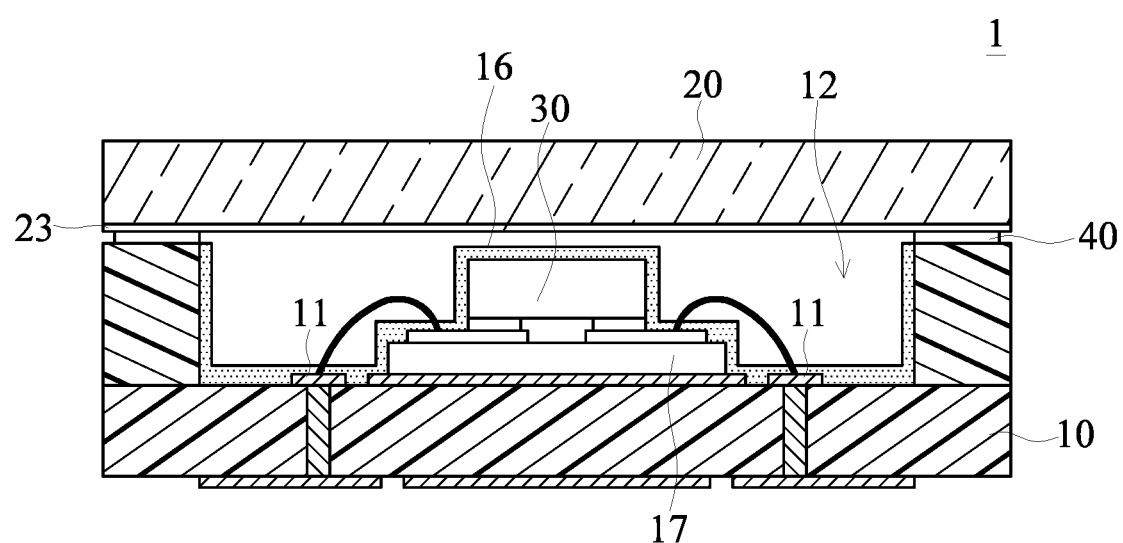
FIG. 12 is an assembled cross sectional view of the light emitting package structure according to a third embodiment of the present disclosure.

FIG. 12 shows a third embodiment of the package structure 1 of the present disclosure. Since the structure of the package structure 1 in this embodiment is similar to those in the above embodiments, the description thereof will not be repeated herein. The differences between this embodiment and the aforementioned embodiments are that a sub substrate 17 is further disposed on the chip mounting pad 11 of the substrate 10, the light emitting unit 30 is further disposed on the sub substrate 17, and the package structure further includes a waterproof layer 16. The waterproof layer 16 is at least coated on the surface of the light emitting unit 30. The material of the waterproof layer 16 may be a silicone resin or a fluorine resin, thereby achieving good waterproofing and isolation effects.

In addition, in this embodiment, an anti-reflection film 23 can further be disposed on the side of the cover element 20 facing the substrate 10 to reduce the loss of light reflected inside the package structure 1 so as to improve the efficiency of light emitting. It should be noted that although the anti-reflection film 23 extends to the second joint area 21 in the FIG. 12, the present disclosure is not limited thereto, that is, the anti-reflection film 23 is not required to extend to the second joint area 21.

Based on the above, the present disclosure has the beneficial effects that the occurrence of skewing of the cover element 20, which is caused by thermal expansion or uneven force of the sealant 40 during the curing of the sealant 40, can be effectively reduced, so as to achieve the effect of improving the yield of the light emitting package structure 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of manufacturing a light emitting package structure including a substrate, a cover element, a light emitting unit and a sealant, an accommodation space being formed between the substrate and the cover element, the light emitting unit being accommodated in the accommodation space, the method comprising:
 a preparation process: mounting the light emitting unit on the substrate under an original ambient pressure;
 a dispensing process: coating the sealant on a first joint area of the substrate under the original ambient pressure, wherein the sealant has an outer profile;
 an cover-enclosing process: disposing the cover element having a second joint area on the substrate under the original ambient pressure, the first joint area and the second joint area being joined to each other by the sealant so as to form the light emitting package structure in a joined status;
 a vacuum process: accommodating the light emitting package structure in the joined status into a vacuum chamber, and reducing an ambient pressure in the vacuum chamber to a first pressure by extracting air, wherein the first pressure is lower than the original ambient pressure, the first pressure is maintained for a predetermined time, so that the pressure of the accommodation space approaches the first pressure;
 a pressure-adjusting process: adjusting the ambient pressure around the light emitting package structure to a second pressure higher than the first pressure, wherein a pressure difference between the first pressure and the second pressure is between 0.01 and 0.03 MPa, to form a negative pressure environment in the accommodation space of the light emitting package structure, so that at least one side of the outer profile of the sealant forms a recess portion recessed toward the accommodation space, and a depth of the recess portion is greater than or equal to a quarter of a width of the first joint area or the second joint area; and
 a curing process: curing the sealant.

2. The method according to claim 1, wherein the first pressure is maintained for 2 to 5 minutes in the vacuum process.

3. The method according to claim 1, wherein the pressure-adjusting process begins during the curing process.

4. The method according to claim 1, wherein a width of the sealant coated on the first joint area is between a quarter and three quarters of a width of the first joint area.

5. The method according to claim 1, wherein the sealant has a thixotropic coefficient between 2.8 and 4.

6. The method according to claim 1, wherein the sealant has a viscosity between 10 Pas and 18 Pas.

7. The method according to claim 1, wherein the curing process further comprises a step of curing the sealant cure at a temperature between 140° C. and 160° C. for a period of time between 180 and 300 minutes.

8. The method according to claim 1, wherein the curing process is a two-stage curing process, a first stage of the curing process is performed under negative pressure, a second stage of the curing process is performed under normal pressure, a heating process is performed under the second pressure and the cure temperature is maintained for 40 to 60 minutes to preliminarily cure the sealant, and the cure temperature is further maintained for 120 to 260 minutes to completely cure the sealant.

9. The method according to claim 1, wherein the sealant is a silicon thermosetting adhesive.

10. The method according to claim 1, further comprising a step of coating a waterproof layer on a surface of the light emitting unit.

11. The method according to claim 10, wherein a material of the waterproof layer is a silicone resin or a fluorine resin.

12. The method according to claim 1, wherein the substrate includes a wall structure, the first joint area is extended from an inner edge of the wall structure to an outer edge of the wall structure of the substrate, the sealant is provided between the first joint area of the wall structure and the second joint area and bonded to the first joint area and the second joint area.

13. The method according to claim 12, wherein the recess portion recessed toward the accommodation space along a traverse direction perpendicular to the at least one side of the outer profile and being in an arc-shaped; wherein an inner side edge of the at least one side of the outer profile is aligned with the inner edge of the wall structure; wherein a maximum depth of the recess portion is greater than or equal to a quarter of a width of the first joint area of the wall structure along the traverse direction.

* * * * *